(12) United States Patent
Yoshida et al.

(10) Patent No.: US 11,348,880 B2
(45) Date of Patent: May 31, 2022

(54) SEMICONDUCTOR DEVICE AND ELECTRONIC APPARATUS

(71) Applicant: Murata Manufacturing Co., Ltd., Nagaokakyo (JP)

(72) Inventors: Yoshihiro Yoshida, Nagaokakyo (JP); Koichi Yoshida, Nagaoka kyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/997,984

(22) Filed: Aug. 20, 2020

(65) Prior Publication Data

US 2020/0381371 A1 Dec. 3, 2020

Related U.S. Application Data

(63) Continuation of application No. PCT/JP2019/007285, filed on Feb. 26, 2019.

(30) Foreign Application Priority Data

Mar. 15, 2018 (JP) .............................. JP2018-048454
Aug. 7, 2018 (JP) .............................. JP2018-148859

(51) Int. Cl.
*H01L 23/00* (2006.01)
*G01L 19/14* (2006.01)
*H01L 23/31* (2006.01)

(52) U.S. Cl.
CPC .......... *H01L 23/564* (2013.01); *G01L 19/148* (2013.01); *H01L 23/3157* (2013.01);
(Continued)

(58) Field of Classification Search
CPC ....... H01L 23/00; H01L 23/31; H01L 23/564; H01L 23/3157; H01L 24/05; H01L 24/13; H01L 24/16; H01L 24/48; H01L 24/49; H01L 24/45; H01L 2224/48091; H01L 2224/48145; H01L 2224/05554; H01L 2224/49171; H01L 2224/48227; H01L 2224/16225; H01L 2224/16145;
(Continued)

(56) References Cited

U.S. PATENT DOCUMENTS

2008/0136955 A1* 6/2008 Kathman .......... H01L 31/02325
348/340
2010/0212433 A1* 8/2010 Hunziker ................ G01F 1/684
73/706
2019/0044069 A1* 2/2019 Nishida ............... H01L 51/0011

FOREIGN PATENT DOCUMENTS

JP 09-257619 A 10/1997
JP 11-287723 A 10/1999
(Continued)

OTHER PUBLICATIONS

Official Communication issued in International Patent Application No. PCT/JP2019/007285, dated Mar. 26, 2019.

*Primary Examiner* — Chuong A Luu
(74) *Attorney, Agent, or Firm* — Keating & Bennett, LLP

(57) ABSTRACT

A semiconductor device includes a base substrate, a detection device provided on the base substrate and including a detector, a first connector electrically connecting the base substrate and the detection device, and a resin package provided on the base substrate and embedded with the detection device and the first connector. The resin package includes an exposure hole exposing the detector of the detection device to the outside, and a concave-convex portion.

35 Claims, 16 Drawing Sheets

(52) U.S. Cl.
CPC .............. *H01L 24/13* (2013.01); *H01L 24/45* (2013.01); *H01L 2924/146* (2013.01)

(58) Field of Classification Search
CPC ..... H01L 2224/0401; H01L 2924/1433; H01L 2924/1461; H01L 2924/181; H01L 2924/1815; H01L 2924/00012; H01L 23/28; H01L 23/29; H01L 23/26; H01L 23/16; H01L 23/3107; H01L 23/315; H01L 21/56; H01L 21/568; H01L 2224/04042; H01L 2224/13099; H01L 2224/05599; H01L 2224/45099
USPC ........................................................ 257/787
See application file for complete search history.

(56) References Cited

FOREIGN PATENT DOCUMENTS

| | | |
|---|---|---|
| JP | 2004-053329 A | 2/2004 |
| JP | 2007-071821 A | 3/2007 |
| JP | 2017-142169 A | 8/2017 |
| JP | 2017-150914 A | 8/2017 |
| JP | 3212911 U | 10/2017 |

* cited by examiner

C-C CROSS SECTION

D-D CROSS SECTION

E-E CROSS SECTION

SEMICONDUCTOR DEVICE AND ELECTRONIC APPARATUS

CROSS REFERENCE TO RELATED APPLICATIONS

This application claims the benefit of priority to Japanese Patent Application No. 2018-148859 filed on Aug. 7, 2018 and Japanese Patent Application No. 2018-048454 filed on Mar. 15, 2018, and is a Continuation Application of PCT Application No. PCT/JP2019/007285 filed on Feb. 26, 2019. The entire contents of each application are hereby incorporated herein by reference.

BACKGROUND OF THE INVENTION

1. Field of the Invention

The present invention relates to a waterproof semiconductor device and an electronic apparatus.

2. Description of the Related Art

As an example of a waterproof semiconductor device, Japanese Registered Utility Model No. 3212911 discloses a waterproof pressure sensor attached to an article of an electronic apparatus, such as a pressure measuring device and configured to measure pressure (for example, atmospheric pressure). In this pressure sensor, a pressure detection device and a circuit element are accommodated in an internal space defined by a housing and a nozzle-type lid attached to the housing. The pressure detection device is electrically connected to the circuit element through bonding wires. Also, the inner space for accommodating the pressure detection device communicates with the outside through a pressure introduction hole formed in the lid.

In the pressure sensor described in Japanese Registered Utility Model No. 3212911, the internal space is filled with a gel sealing resin, such as fluorine gel or silicon gel. The pressure detection device, the circuit element, and the bonding wires for connecting the pressure detection device and the circuit element are embedded in the gel sealing resin. Thus, electrical connection between the pressure detection device and the circuit element (the bonding wires, and pads on the pressure detection device and pads on the circuit element connected by the bonding wires) is waterproofed against liquid such as water entering the internal space of the pressure sensor from the outside. Note that pressure to be measured is transmitted to the pressure detection device by the gel sealing resin. Additionally, in the pressure sensor described in Japanese Registered Utility Model No. 3212911, an outer circumferential surface of the lid is configured to support an O-ring in order to prevent liquid from entering into the article through a gap between the article and the lid of the pressure sensor.

However, in the pressure sensor described in Japanese Registered Utility Model No. 3212911, the gel sealing resin, such as the fluorine gel or the silicon gel, may be repeatedly deformed or chemically transformed due to the influence of pressure measurement environment, and as a result, waterproof performance and detection performance of pressure (transmission capacity of pressure) may be deteriorated. Further, in the pressure sensor described in Japanese Registered Utility Model No. 3212911, the internal space for accommodating the gel sealing resin and protecting the gel sealing resin from an external force or the like other than pressure is required. Further, the electronic apparatus including the pressure sensor described in Japanese Registered Utility Model No. 3212911 includes an O-ring, and a pressure sensor supporting the O-ring, and a portion supporting the O-ring in the pressure sensor necessarily has hardness capable of resisting a repulsive force of the O-ring compressively deformed in the gap between the article and the pressure sensor. That is, although the pressure sensor described in Japanese Registered Utility Model No. 3212911 achieves the waterproof performance and the detection performance of the pressure with a complicated structure, there is a concern that the waterproof performance and the detection performance may be deteriorated.

SUMMARY OF THE INVENTION

Preferred embodiments of the present invention provide semiconductor devices and electronic apparatuses including the semiconductor devices, that each reduce or prevent a decrease in waterproof performance and detection performance while achieving the waterproof performance and the detection performance with a simple structure.

According to a preferred embodiment of the present invention, a semiconductor device includes a base substrate, a detection device provided on the base substrate and including a detector, a first connector electrically connecting the base substrate and the detection device, and a resin package provided on the base substrate and embedded with the detection device and the first connector, wherein the resin package includes an exposure hole exposing the detector of the detection device to the outside, and a concave-convex portion.

According to a preferred embodiment of the present invention, an electronic apparatus includes a semiconductor device according to a preferred embodiment of the present invention, an O-ring supported by the concave-convex portion of the semiconductor device, and a housing to which the semiconductor device and the O-ring are attached.

According to preferred embodiments of the present invention, in semiconductor devices and electronic apparatuses including the semiconductor devices, it is possible to reduce or prevent a decrease in waterproof performance and detection performance while achieving the waterproof performance and the detection performance with a simple structure.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
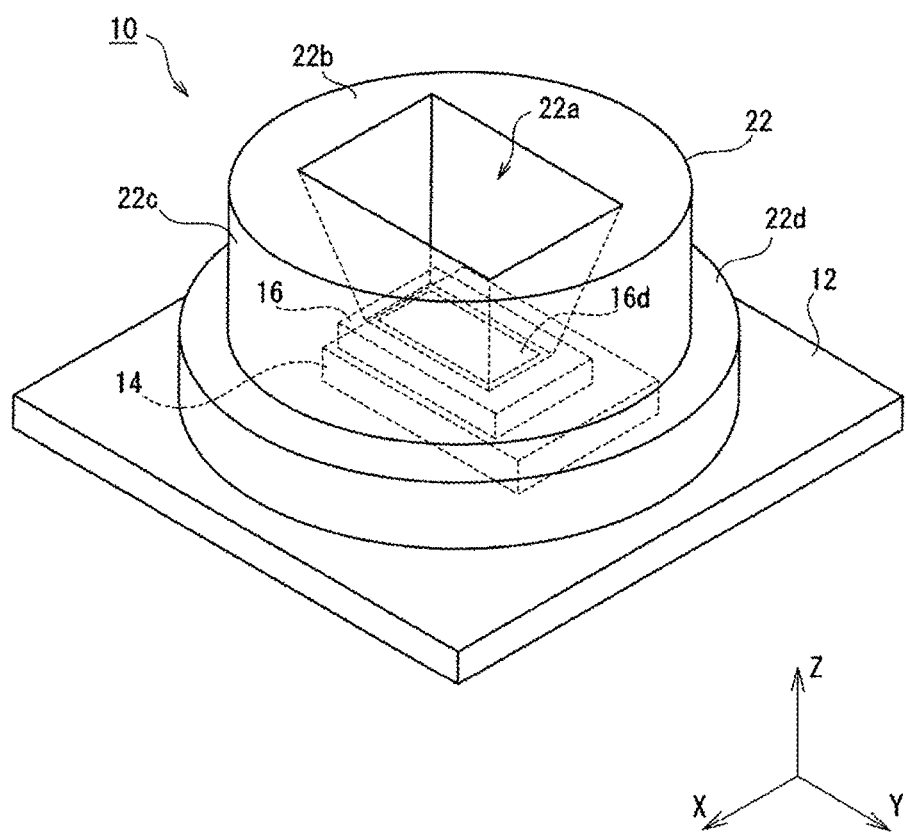
FIG. 1 is a perspective view of a semiconductor device according to a Preferred Embodiment 1 of the present invention.

A semiconductor device according to a preferred embodiment of the present invention includes a base substrate, a detection device provided on the base substrate and including a detector, a first connector electrically connecting the base substrate and the detection device, and a resin package provided on the base substrate and embedded with the detection device and the first connector, and the resin package includes an exposure hole exposing the detector of the detection device to the outside and a concave-convex portion.

According to this preferred embodiment, in the semiconductor device, it is possible to reduce or prevent a decrease in waterproof performance and detection performance while achieving the waterproof performance and the detection performance with a simple structure.

The resin package may include an outer circumferential surface having a cylindrical or substantially cylindrical shape and a flange portion continuous with the outer circumferential surface, as the concave-convex portion.

The resin package may include a circumferential groove provided on an outer circumferential surface of the resin package, as the concave-convex portion.

The resin package may include an annular groove provided on a first surface on which the exposure hole is open and surrounding an opening portion of the exposure hole, as the concave-convex portion.

In the resin package, a groove extending outward from the annular groove may be provided in a thinner portion than another portion on an outer circumferential wall portion of the annular groove. Due to this groove, chipping of the thin portion is reduced or prevented.

The semiconductor device may further include a circuit element provided on the base substrate, and a second connector electrically connecting the base substrate and the circuit element, and the circuit element and the second connector may be embedded in the resin package.

The detection device may be provided on the base substrate with the circuit board interposed therebetween.

The first connector may be electrically connected to the base substrate through the circuit element and the second connector.

In a top view, a center of the circuit element and a center of the detection device may coincide or substantially coincide with each other. With such arrangement, it is possible to reduce a variation in stress applied to the circuit element and the detection device from the surrounding resin package as compared with a case where the centers are offset from each other.

The semiconductor device may further include a circuit element incorporated in the detection device.

The base substrate may include a signal processing circuit configured to process an output signal of the detection device.

The connector may be a bonding wire or a bump, for example.

The detection device may be, for example, a pressure sensor configured to detect a change in pressure.

An electronic apparatus according to a preferred embodiment of the present invention includes a semiconductor device, an O-ring supported by the concave-convex portion of the semiconductor device, and a housing to which the semiconductor device and the O-ring are attached.

According to this preferred embodiment, in the electronic apparatus including the semiconductor device, it is possible to reduce or prevent a decrease in waterproof performance and detection performance while achieving the waterproof performance and the detection performance with a simple structure.

Hereinafter, preferred embodiments of the present invention will be described with reference to the drawings.

Preferred Embodiment 1

Figure 2A:
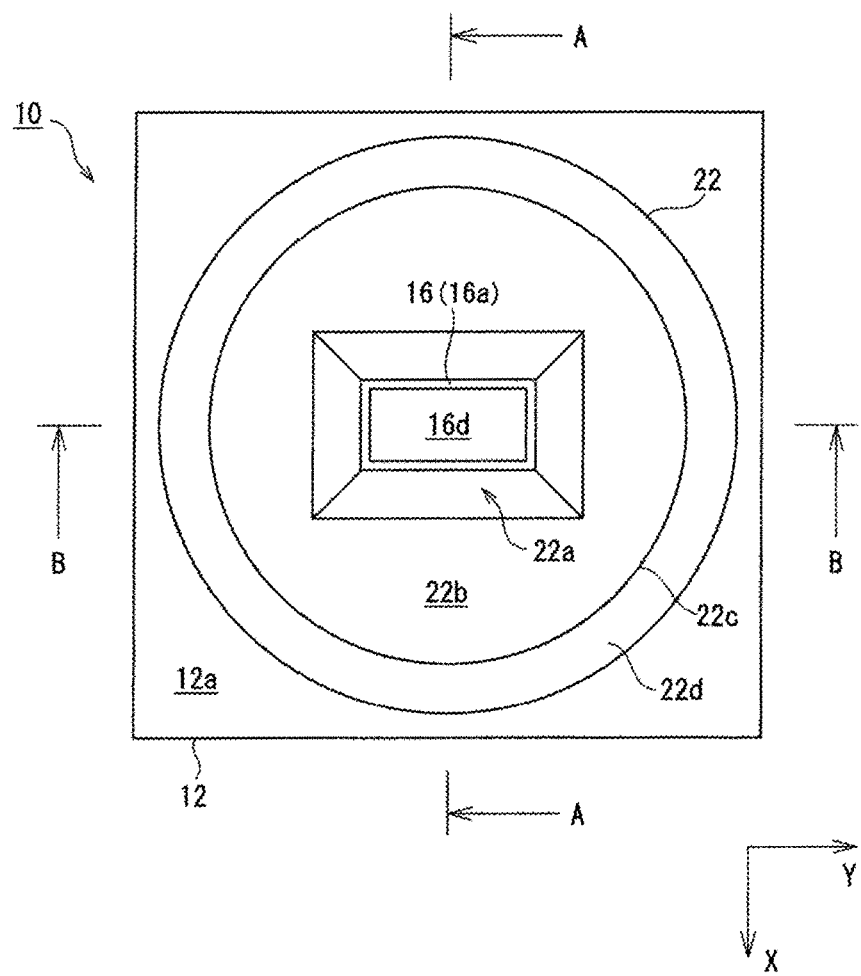
FIG. 2A is a top view of the semiconductor device according to Preferred Embodiment 1 of the present invention.
Figure 2B:
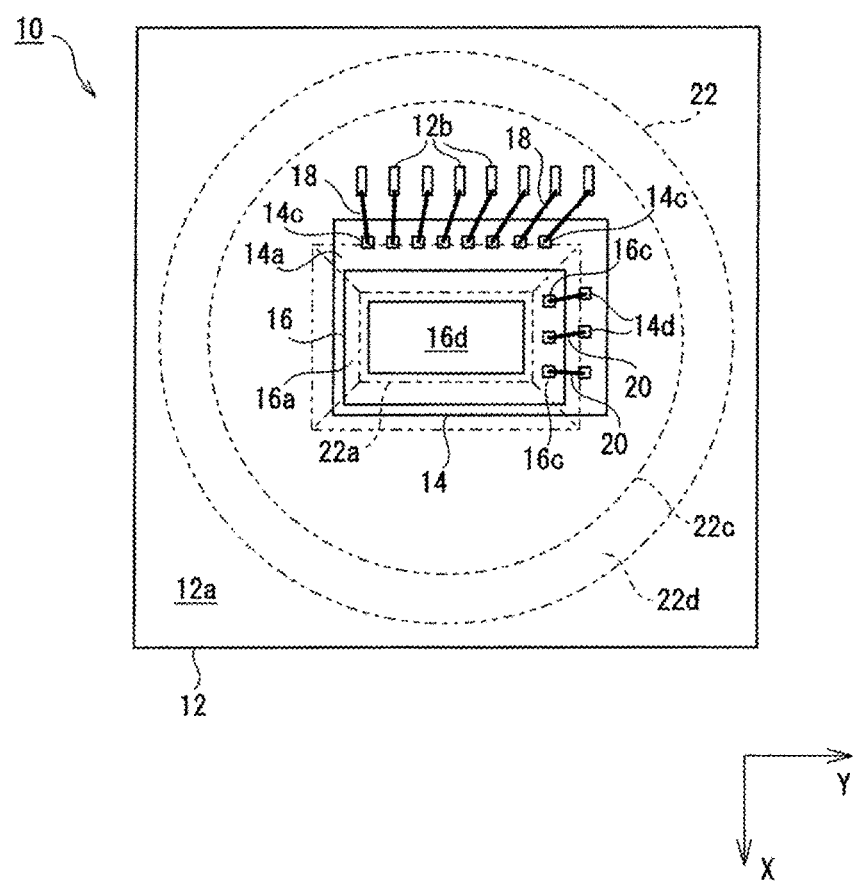
FIG. 2B is a top view of the semiconductor device according to Preferred Embodiment 1 of the present invention in a state in which the inside of a resin package is illustrated.
Figure 3A:
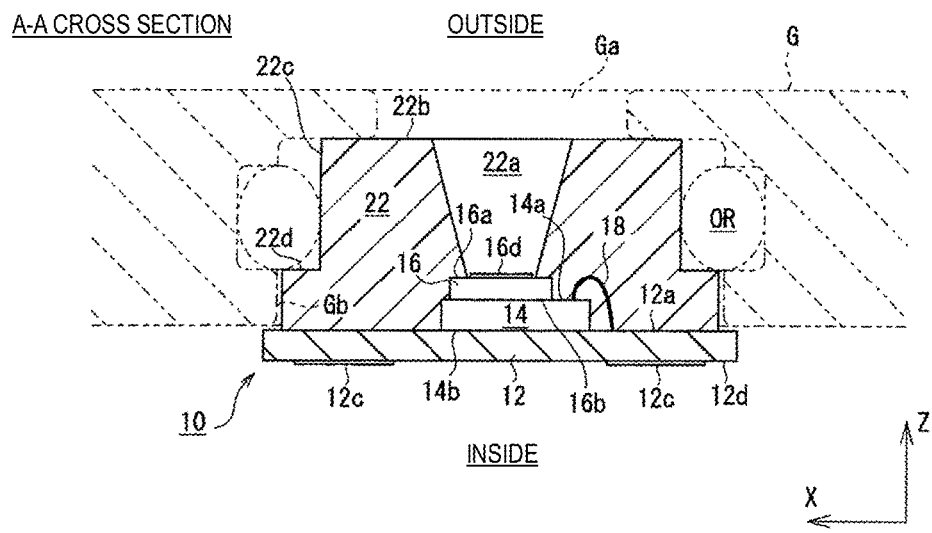
FIG. 3A is a cross-sectional view of the semiconductor device taken along a line A-A in FIG. 2A.
Figure 3B:
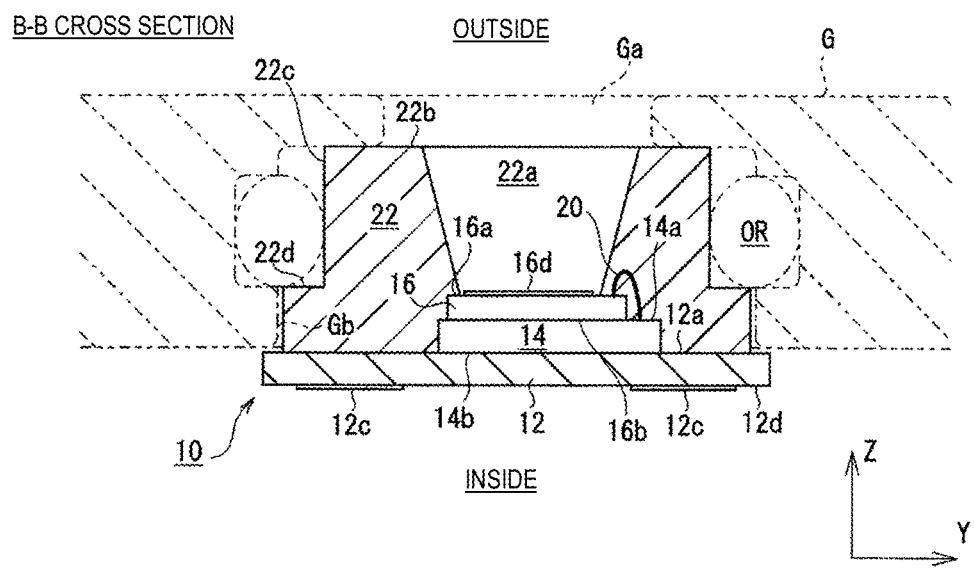
FIG. 3B is a cross-sectional view of the semiconductor device taken along a line B-B in FIG. 2A.

FIG. 1 is a perspective view of a semiconductor device according to Preferred Embodiment 1 of the present invention. FIGS. 2A and 2B are top views of the semiconductor device according to Preferred Embodiment 1. Note that, in FIG. 2B, the inside of a resin package is illustrated. FIG. 3A is a cross-sectional view taken along a line A-A in FIG. 2A, and FIG. 3B is a cross-sectional view taken along a line B-B in FIG. 2A. An X-Y-Z orthogonal coordinate system illustrated in these figures is to facilitate the understanding of the present invention, and is not intended to limit the present invention.

A semiconductor device 10 according to Preferred Embodiment 1 is a pressure sensor that measures pressure, and as illustrated in FIG. 1, includes a base substrate 12, a circuit element 14 provided on the base substrate 12, and a detection device 16 provided on the circuit element 14.

As illustrated in FIGS. 3A and 3B, the base substrate 12 includes a first surface 12a, and the circuit element 14 is mounted on the first surface 12a. In addition, as illustrated in FIG. 2B, the base substrate 12 includes a plurality of pads 12b provided on the first surface 12a and electrically connected to the circuit element 14. The base substrate 12 includes external connection terminals 12c on a second surface 12d opposed to the first surface 12a. The semiconductor device 10 is electrically connected to another external device (not illustrated) by the external connection terminal 12c.

As illustrated in FIGS. 3A and 3B, the circuit element 14 includes a first surface 14a, and a second surface 14b opposed to the first surface 14a. The circuit element 14 includes an application specific integrated circuit (ASIC), for example. In a case of Preferred Embodiment 1, the circuit element 14 is mounted on the first surface 12a of the base substrate 12 by the second surface 14b thereof. Additionally, as illustrated in FIG. 2B, the circuit element 14 includes a plurality of first pads 14c provided on the first surface 14a and electrically connected to the pads 12b of the base substrate 12. The first pad 14c of the circuit element 14 and the pad 12b of the base substrate 12 are electrically connected to each other through a bonding wire 18 which is a connector. In addition to the first pads 14c, the circuit element 14 includes a plurality of second pads 14d electrically connected to the detection device 16 on the first surface 14a thereof.

Further, the circuit element 14 includes a signal processing circuit that processes a signal output from the detection device 16 and outputs the processed signal to the base substrate 12. For example, in the case of Preferred Embodiment 1, the circuit element 14 preferably includes a converter that converts a voltage signal output from the detection device 16 into a digital signal, a filter that filters the digital signal from the converter, a temperature sensor that detects temperature, a processor that corrects the filtered digital signal based on the detected temperature of the temperature sensor, a memory that stores a correction coefficient or the like that is used when the digital signal is corrected by using the detected temperature, and the like.

In the case of Preferred Embodiment 1, the detection device 16 is a pressure sensor to measure pressure, and, as illustrated in FIGS. 3A and 3B, includes a first surface 16a and a second surface 16b. The detection device 16 is preferably, for example, a piezoresistive pressure sensor or an electrostatic capacitance pressure sensor, and is a micro electro mechanical system (MEMS) element. In the case of Preferred Embodiment 1, the detection device 16 is provided on the base substrate 12 with the circuit element 14 interposed therebetween. More specifically, the detection device 16 is mounted on the first surface 14a of the circuit element 14 by the second surface 16b thereof.

Additionally, as illustrated in FIG. 2B, the detection device 16 includes a plurality of pads 16c provided on the first surface 16a and electrically connected to the plurality of second pads 14d of the circuit element 14. The pad 16c of the detection device 16 and the second pad 14d of the circuit element 14 are electrically connected to each other through a bonding wire 20 which is a connector. That is, the bonding wire 20 of the detection device 16 is electrically connected to the base substrate 12 through the circuit element 14 and the bonding wire 18.

Further, the detection device 16 includes a detector 16d on which pressure acts on the first surface 16a thereof. In the case of Preferred Embodiment 1, the detector 16d of the detection device 16 which is a pressure sensor is a membrane or a diaphragm that receives pressure. Note that the detector 16d includes, for example, a passivation film, and is waterproofed.

As illustrated in FIG. 1 and FIGS. 3A and 3B, the circuit element 14, the detection device 16, and the bonding wires 18 and 20 that electrically connect these elements are embedded in the resin package 22.

Specifically, the resin package 22 is a package produced by molding hard resin such as, for example, thermosetting resin onto the first surface 12a of the base substrate 12. By being covered by the resin package 22, a portion of the first surface 12a of the base substrate 12 including the plurality of pads 12b is protected and waterproofed. Further, by being embedded in the resin package 22, the circuit element 14 (in particular, the first and second pads 14c and 14d), the detection device 16 (in particular, the pads 16c), and the bonding wires 18 and 20 that electrically connect these elements are protected and waterproofed. That is, electrical connection between the base substrate 12 and the circuit element 14 and electrical connection between the circuit element 14 and the detection device 16 are waterproofed by the resin package 22.

As illustrated in FIG. 1 and FIG. 2A, the resin package 22 includes an exposure hole 22a to expose the detector 16d of the detection device 16 to the outside of the resin package 22 so that pressure acts on the detector 16d of the detection device 16. In the case of Preferred Embodiment 1, the exposure hole 22a is open in a stacking direction (Z-axis direction) of the base substrate 12, the circuit element 14, and the detection device 16. An opening portion of the exposure hole 22a is provided on a first surface 22b (a surface in a positive direction of the Z-axis) of the resin package 22. The exposure hole 22a causes pressure to act on the detector 16d of the detection device 16 exposed to the outside of the resin package 22, and the detection device 16 can measure the pressure. Note that a portion of the detection device including the detector 16d exposed to the outside by the exposure hole 22a is waterproofed by, for example, a passivation film. In addition, in the case of Preferred Embodiment 1, the exposure hole 22a has a tapered shape in which the opening portion is rectangular or substantially rectangular in a top view (in the Z-axis direction) as illustrated in FIG. 1 and a cross-sectional area decreases as it approaches the detector 16d of the detection device 16 from the opening portion as illustrated in FIGS. 3A and 3B. The exposure hole 22a only needs to function as a pressure introduction hole to introduce pressure into the detector 16d.

Additionally, as illustrated in FIGS. 3A and 3B, the resin package 22 supports an O-ring OR. The O-ring OR will be described in detail with reference to FIGS. 3A and 3B.

As illustrated in FIGS. 3A and 3B, the semiconductor device 10 is attached to and used by an article G of an electronic apparatus. The article G is a housing of an electronic apparatus such as a pressure measuring device, for example. The article G is provided with a through-hole Ga to communicate between the inside and the outside of the article G, and the semiconductor device 10 is disposed in the through-hole Ga. In order to measure pressure outside the article G, the semiconductor device 10 is attached to the article G such that the exposure hole 22a of the resin package 22 communicates with the outside. In order to seal a gap between the semiconductor device 10 disposed in this way and an inner circumferential surface Gb of the through-hole Ga of the article G, the O-ring OR is disposed in this gap.

In order to support such an O-ring OR, the resin package 22 of the semiconductor device 10 includes a concave-convex portion. In Preferred Embodiment 1, as illustrated in FIG. 1, FIGS. 3A, and 3B, the resin package 22 includes an outer circumferential surface 22c that has a cylindrical or substantially cylindrical shape and to which the O-ring OR is fitted, and a flange portion 22d continuous with the outer circumferential surface 22c, as the concave-convex portion. The flange portion 22d receives the O-ring OR fitted to the outer circumferential surface 22c. By such a concave-convex portion, the O-ring OR is supported by the semiconductor device 10 such that the exposure hole 22a is positioned in the O-ring OR as viewed in an opening direction (Z-axis direction) of the exposure hole 22a of the resin package 22. In addition, the semiconductor device 10 can be attached to the article G in a state where the O-ring OR is supported by the concave-convex portion of the resin package 22. Note that, since the resin package 22 is made of hard resin, deformation is reduced or prevented due to a repulsive force of the O-ring OR that is compressively deformed in a gap between the article G and the resin package 22. Accordingly, the resin package 22 can maintain the waterproof performance for the electrical connection between the base substrate 12 and the circuit element 14 and the electrical connection between the circuit element 14 and the detection device 16.

According to Preferred Embodiment 1 described above, in the semiconductor device 10, it is possible to reduce or prevent a decrease in waterproof performance and detection performance, while achieving the waterproof performance and the detection performance with a simple structure.

Specifically, in the semiconductor device 10, the electrical connection between the base substrate 12 and the circuit element 14 (the pad 12b through the bonding wire 18 to the first pad 14c) and the electrical connection between the circuit element 14 and the detection device 16 (the second pad 14d through the bonding wire 20 to the pad 16c) are embedded in the resin package 22 and thus are waterproofed instead of being embedded in the gel sealing resin as used by the pressure sensor described in Japanese Registered Utility Model No. 3212911.

The gel sealing resin such as fluorine gel or silicon gel is likely to be repeatedly deformed or chemically transformed due to the influence of pressure measurement environment, compared to the resin package 22 made of hard resin. Therefore, the gel sealing resin tends to reduce the waterproof performance compared to the resin package 22. In a semiconductor device (pressure sensor) including the gel sealing resin, for example, cracks due to repeated deformation or chemical transformation may be generated and grown, and the waterproof performance may be deteriorated.

On the other hand, since the resin package 22 according to Preferred Embodiment 1 is harder than the gel sealing resin (since the resin package 22 is difficult to deform) and is hardly chemically transformed, the waterproof performance of the resin package 22 is less likely to be deteriorated. Thus, the resin package 22 can maintain the waterproof performance for each of the electrical connection between the base substrate 12 and the circuit element 14 and the electrical connection between the circuit element 14 and the detection device 16 while reducing or preventing a decrease in waterproof performance compared to the gel sealing resin.

Further, when waterproofing is performed with the gel sealing resin such as fluorine gel or silicon gel, the semiconductor device (pressure sensor) needs an internal space to accommodate the gel sealing resin and protect the gel sealing resin from an external force or the like. Further, in a case where the semiconductor device supports an O-ring, it is necessary for the semiconductor device to include a portion supporting the O-ring with hardness capable of resisting a repulsive force of the O-ring compressively deformed in a gap between an article and the pressure sensor. That is, such a semiconductor device requires a complicated structure in order to achieve the waterproof performance.

On the other hand, in a case of the semiconductor device 10 according to Preferred Embodiment 1, since the gel sealing resin is not required, the internal space to accommodate the gel sealing resin is not required. Further, since the resin package 22 in which the electrical connection between the base substrate 12 and the circuit element 14 and the electrical connection between the circuit element 14 and the detection device 16 are waterproofed supports the O-ring OR, it is not necessary to separately provide an element to support the O-ring OR. Therefore, the semiconductor device 10 according to Preferred Embodiment 1 has a simple structure to achieve and maintain the waterproof performance.

Further, in the case of the semiconductor device 10 according to Preferred Embodiment 1, the detector 16d of the detection device 16 to detect pressure is not covered with the gel sealing resin. Elastic performance (transmission capacity of pressure) of the gel sealing resin easily decreases because of repetitive deformation and chemical transformation due to the influence of pressure measurement environment. In the semiconductor device (pressure sensor) including the gel sealing resin, for example, a crack occurs due to the repetitive deformation, pressure acting on the gel sealing resin promotes growth of the crack, and therefore, the pressure transmitted to the pressure detection device by the gel sealing resin tends to be low. Since the detector 16d of the detection device 16 is not covered by such gel sealing resin, the detection performance of the pressure by the detection device 16 can be maintained while a decrease in detection performance is reduced or prevented.

As described above, the semiconductor device 10 according to Preferred Embodiment 1 does not include the gel sealing resin and an element necessary for the gel sealing resin, and therefore, it is possible to achieve the waterproof performance and the detection performance with a simple structure while reducing or preventing a decrease in the waterproof performance and the detection performance.

Preferred Embodiment 2

Preferred Embodiment 2 of the present invention is the same or substantially the same as Preferred Embodiment 1 described above except that a shape of the concave-convex portion of the resin package that supports the O-ring is different from that in Preferred Embodiment 1. Therefore, a semiconductor device according to Preferred Embodiment 2 will be described focusing on a different point. Note that elements the same or substantially the same as those of Preferred Embodiment 1 described above are denoted by the same reference signs.

Figure 4:
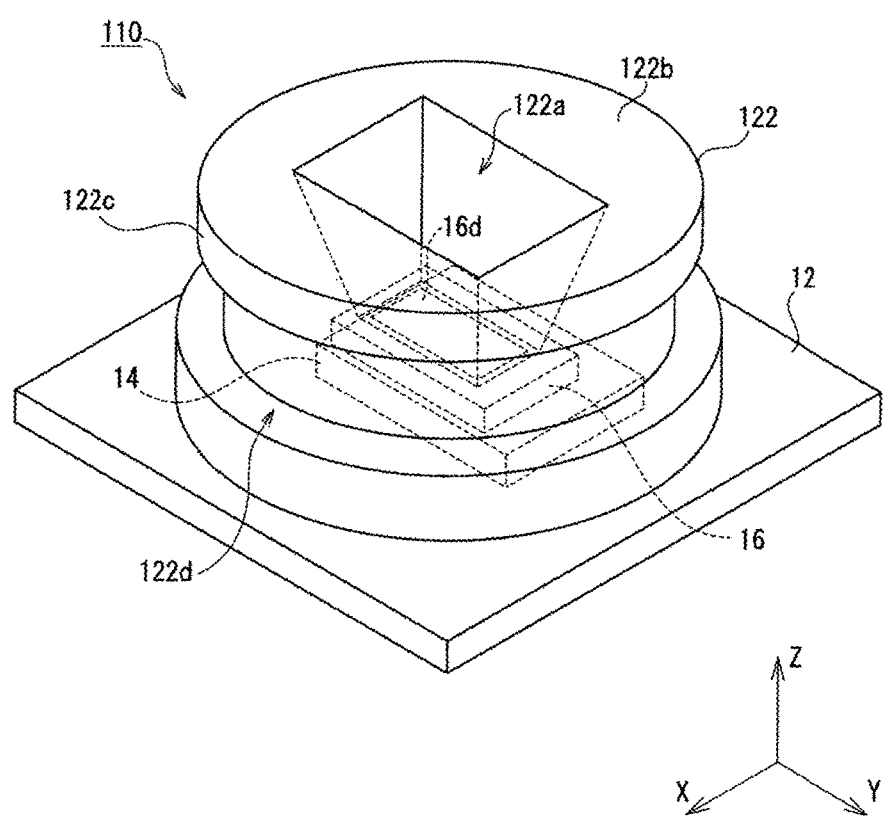
FIG. 4 is a perspective view of a semiconductor device according to a Preferred Embodiment 2 of the present invention.
Figure 5:
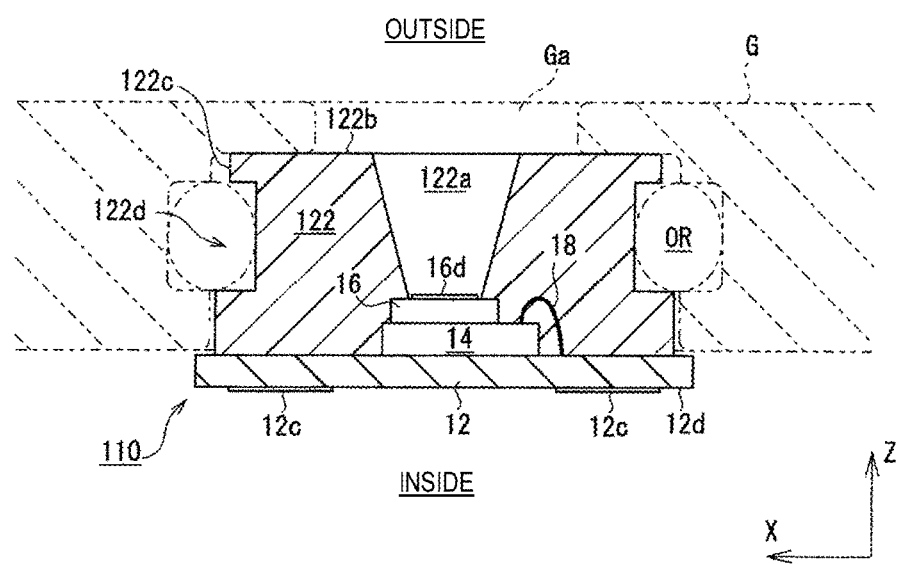
FIG. 5 is a cross-sectional view of the semiconductor device according to Preferred Embodiment 2 of the present invention.

FIG. 4 is a perspective view of the semiconductor device according to Preferred Embodiment 2. FIG. 5 is a cross-sectional view of the semiconductor device according to Preferred Embodiment 2.

As illustrated in FIG. 4 and FIG. 5, in a semiconductor device 110 according to Preferred Embodiment 2, a resin package 122 in which the circuit elements 14, the detection device 16, and the bonding wires 18 and 20 electrically connecting these elements are embedded is provided with a circumferential groove 122d to accommodate the O-ring OR as a concave-convex portion to support the O-ring OR. The circumferential groove 122d is provided on an outer circumferential surface 122c of the resin package 122, and includes a cylindrical bottom surface and a depth that enables the O-ring OR to be partially accommodated therein. When the O-ring OR is accommodated in the circumferential groove 122d, the O-ring OR is restricted from moving in an opening direction (Z-axis direction) of an exposure hole 122a of the resin package 122. As a result, it is possible to reduce or prevent falling off of the O-ring OR from the semiconductor device 110.

In Preferred Embodiment 2, similarly to Preferred Embodiment 1, in the semiconductor device 110, it is possible to reduce or prevent a decrease in waterproof performance and detection performance while achieving the waterproof performance and the detection performance with a simple structure.

Preferred Embodiment 3

Preferred Embodiment 3 of the present invention is the same or substantially the same as Preferred Embodiment 1 described above except that a shape of the concave-convex portion of the resin package that supports the O-ring is different from that in Preferred Embodiment 1. Therefore, a semiconductor device according to Preferred Embodiment 3 will be described focusing on a different point. Note that elements the same or substantially the same as those of Preferred Embodiment 1 described above are denoted by the same reference signs.

Figure 6:
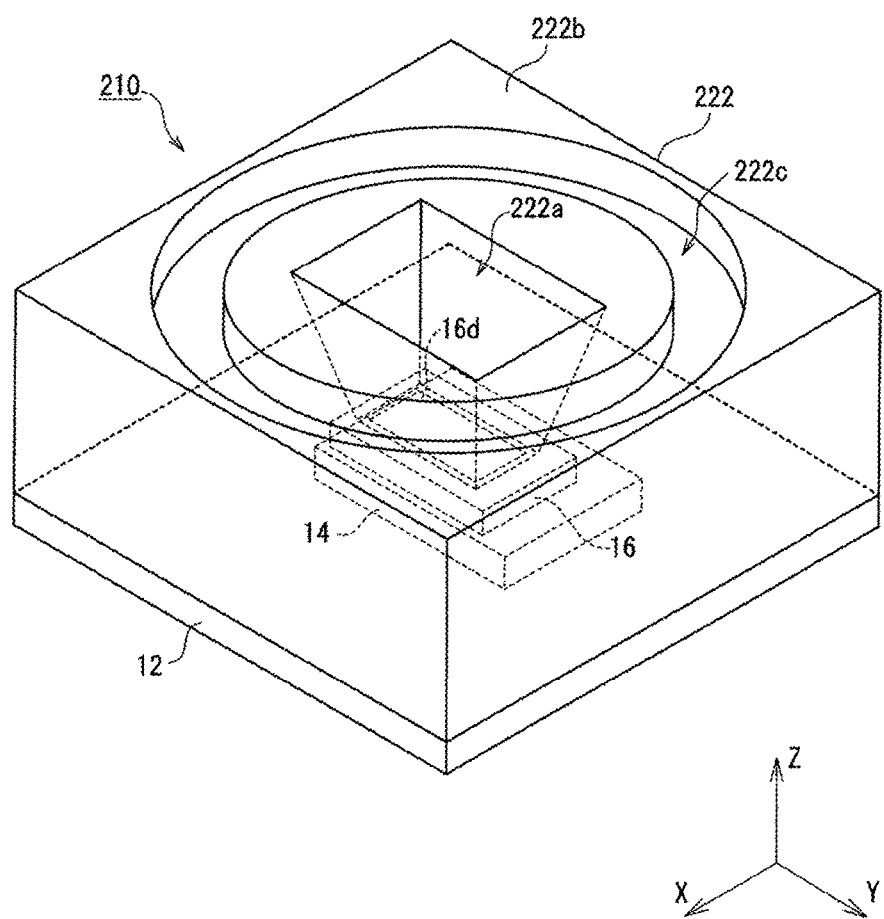
FIG. 6 is a perspective view of a semiconductor device according to a Preferred Embodiment 3 of the present invention.
Figure 7:
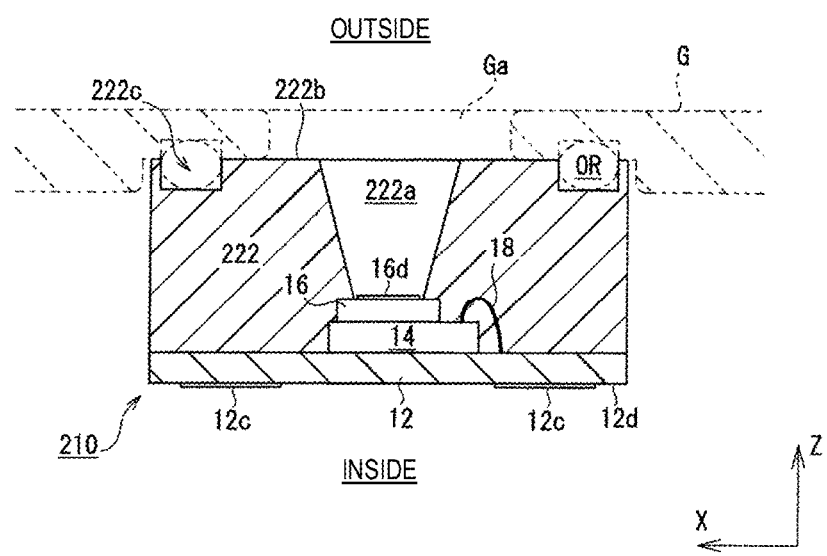
FIG. 7 is a cross-sectional view of the semiconductor device according to Preferred Embodiment 3 of the present invention.

FIG. 6 is a perspective view of the semiconductor device according to Preferred Embodiment 3. FIG. 7 is a cross-sectional view of the semiconductor device according to Preferred Embodiment 3.

As illustrated in FIG. 6 and FIG. 7, in a semiconductor device 210 according to Preferred Embodiment 3, a resin package 222 in which the circuit element 14, the detection device 16, and the bonding wires 18 and 20 electrically connecting these elements are embedded includes an annular groove 222c to accommodate the O-ring OR as a concave-convex portion to support the O-ring OR. The annular groove 222c is provided on a first surface 222b (a surface in the positive direction of the Z-axis) of the resin package 222 in which an exposure hole 222a is open, and surrounds an opening portion of the exposure hole 222a. Further, the annular groove 222c has a depth that enables the O-ring OR to be partially accommodated therein. By enabling the O-ring OR to be accommodated in such an annular groove 222c, as illustrated in FIG. 7, when a thickness of the article G is small, that is, when the article G is not provided with an inner circumferential surface facing an outer circumferential surface of the resin package 222, a gap between the article G and the semiconductor device 210 can be sealed.

In Preferred Embodiment 3, similarly to Preferred Embodiment 1, in the semiconductor device 210, it is possible to reduce or prevent a decrease in waterproof performance and detection performance while achieving the waterproof performance and the detection performance with a simple structure.

Preferred Embodiment 4

Preferred Embodiment 4 of the present invention is the same or substantially the same as Preferred Embodiment 1 described above except that an electrical connection configuration between the base substrate and the circuit element and an electrical connection configuration between the circuit element and the detection device are different. Therefore, a semiconductor device according to Preferred Embodiment 4 will be described focusing on a different point. Note that elements the same or substantially the same as those of Preferred Embodiment 1 described above are denoted by the same reference signs.

Figure 8:
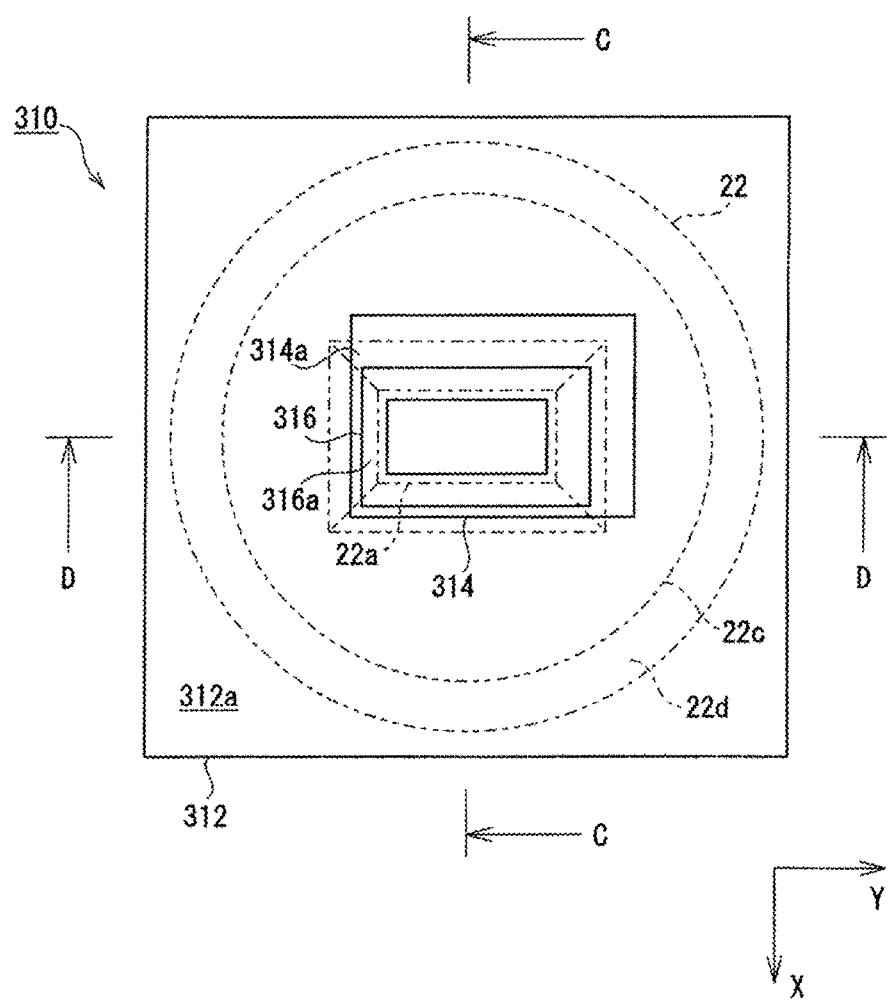
FIG. 8 is a top view of a semiconductor device according to a Preferred Embodiment 4 of the present invention in a state in which the inside of a resin package is illustrated.

FIG. 8 is a top view of a semiconductor device according to Preferred Embodiment 4. Note that, in FIG. 8, the inside of a resin package is illustrated. Additionally, FIG. 9A is a cross-sectional view taken along a line C-C in FIG. 8, and FIG. 9B is a cross-sectional view taken along a line D-D in FIG. 8.

Figure 9A:
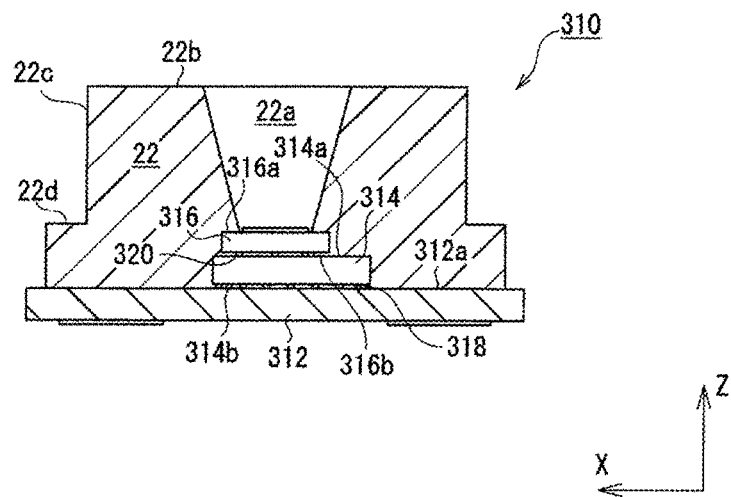
FIG. 9A is a cross-sectional view of the semiconductor device taken along a line C-C in FIG. 8.
Figure 9B:
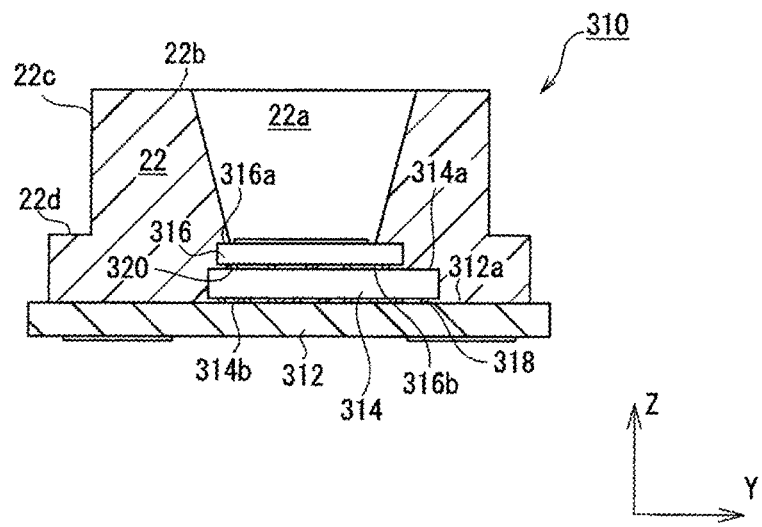
FIG. 9B is a cross-sectional view of the semiconductor device taken along a line D-D in FIG. 8.

As illustrated in FIG. 8 and FIGS. 9A and 9B, in a semiconductor device 310 according to Preferred Embodiment 4, a base substrate 312 and a circuit element 314 are electrically connected to each other with bumps 318 interposed therebetween, and the circuit element 314 and a detection device 316 are electrically connected to each other with bumps 320 interposed therebetween. As described above, the semiconductor device 310 according to Preferred Embodiment 4 includes the bumps 318 and 320 instead of the bonding wires 18 and 20 of the semiconductor device according to Preferred Embodiment 1 described above. Accordingly, a second surface 314b of the circuit element 314 is provided with first pads (not illustrated) electrically connected to pads (not illustrated) provided on a first surface 312a of the base substrate 312 with the bumps 318 interposed therebetween. Further, a first surface 314a of the circuit element 314 is provided with second pads (not illustrated) electrically connected to pads (not illustrated) provided on a second surface 316b of the detection device 316 with the bumps 320 interposed therebetween. In Preferred Embodiment 4, the respective pads are provided between the base substrate 312 and the circuit element 314 and between the circuit element 314 and the detection device 316. Therefore, the semiconductor device 310 according to Preferred Embodiment 4 can reduce sizes of the base substrate, the circuit element, and the detection device, as compared with the semiconductor device 10 according to Preferred Embodiment 1 including the first and second bonding wires 18 and 20, and thus can reduce a size of the semiconductor device 310 as a whole.

In Preferred Embodiment 4, similarly to Preferred Embodiment 1, in the semiconductor device 310, it is possible to reduce or prevent a decrease in waterproof performance and detection performance while achieving the waterproof performance and the detection performance with a simple structure.

Also in Preferred Embodiments 2 and 3 described above, as in Preferred Embodiment 4, the electrical connection between the base substrate and the circuit element and the electrical connection between the circuit element and the detection device may be provided by bumps.

Although the present invention has been described above with reference to a plurality of preferred embodiments, the preferred embodiments of the present invention are not limited thereto.

For example, in the case of Preferred Embodiment 4 described above, as illustrated in FIGS. 9A and 9B, both of the electrical connection between the base substrate 312 and the circuit element 314 and the electrical connection between the circuit element 314 and the detection device 316 are provided with the bumps interposed therebetween.

Alternatively, any one of the electrical connections may be provided through bonding wires.

Further, the detection device may be directly electrically connected to the base substrate through bonding wires or bumps without the circuit element interposed therebetween.

Preferred Embodiment 5

Figure 10:
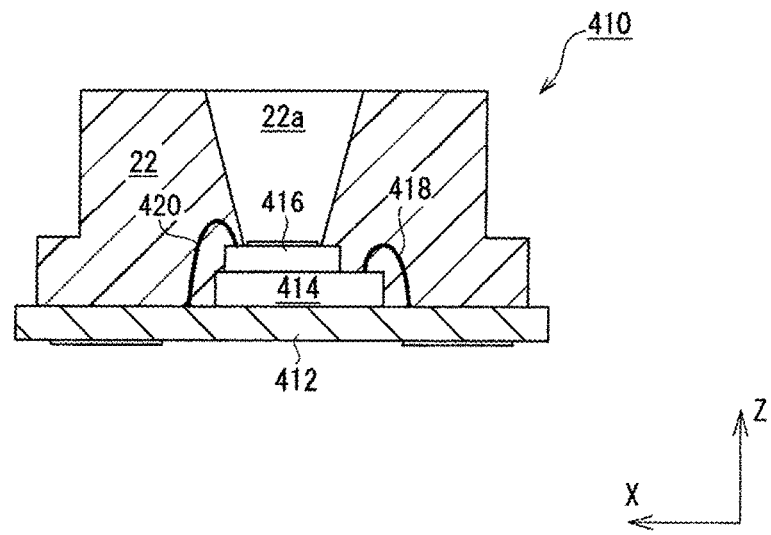
FIG. 10 is a cross-sectional view of a semiconductor device according to a Preferred Embodiment 5 of the present invention.

FIG. 10 is a cross-sectional view of a semiconductor device according to Preferred Embodiment 5 of the present invention.

As illustrated in FIG. 10, in a semiconductor device 410 according to Preferred Embodiment 5, a detection device 416 is directly electrically connected to a base substrate 412 through bonding wires 420, without a circuit element 414 interposed therebetween. Electrical connection between the detection device 416 and the circuit element 414 is provided through a conductor pattern or the like, for example, in or on the base substrate 412.

Preferred Embodiment 6

Figure 11:
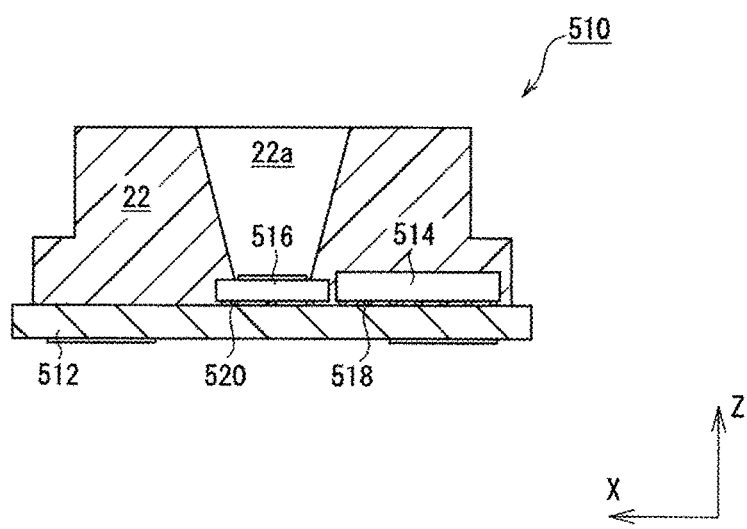
FIG. 11 is a cross-sectional view of a semiconductor device according to a Preferred Embodiment 6 of the present invention.

FIG. 11 is a cross-sectional view of a semiconductor device according to Preferred Embodiment 6 of the present invention.

As illustrated in FIG. 11, in a semiconductor device 510 according to Preferred Embodiment 6, a detection device 516 is not provided on a base substrate 512 with a circuit element 514 interposed therebetween. Instead, the detection device 516 is directly provided on the base substrate 512, similarly to the circuit element 514. That is, the detection device 516 and the circuit element 514 are provided on the base substrate 512 in a state of being aligned in parallel or substantially in parallel with respect to the base substrate 512. Further, the detection device 516 and the circuit element 514 are electrically connected to the base substrate 512 with the bumps 518 and 520 respectively interposed therebetween. Electrical connection between the detection device 516 and the circuit element 514 is provided through a conductor pattern or the like, for example, in or on the base substrate 512. As described above, by directly providing the detection device 516 on the base substrate 512, the semiconductor device 510 can be reduced in height (a size thereof in the Z-axis direction can be reduced) as compared with a case where the detection device 516 is provided on the base substrate 512 with the circuit element 514 interposed therebetween. Note that at least one of the detection device 516 and the circuit element 514 may be electrically connected to the base substrate 512 through bonding wires instead of bumps.

In addition, in the case of Preferred Embodiment 1 described above, as illustrated in FIG. 2B, the center of the exposure hole 22a of the resin package 22, the center of the circuit element 14, and the center of the detection device 16 do not coincide with each other (are offset from each other) in a top view. However, a preferred embodiment of the present invention is not limited to this.

Preferred Embodiment 7

Figure 12:
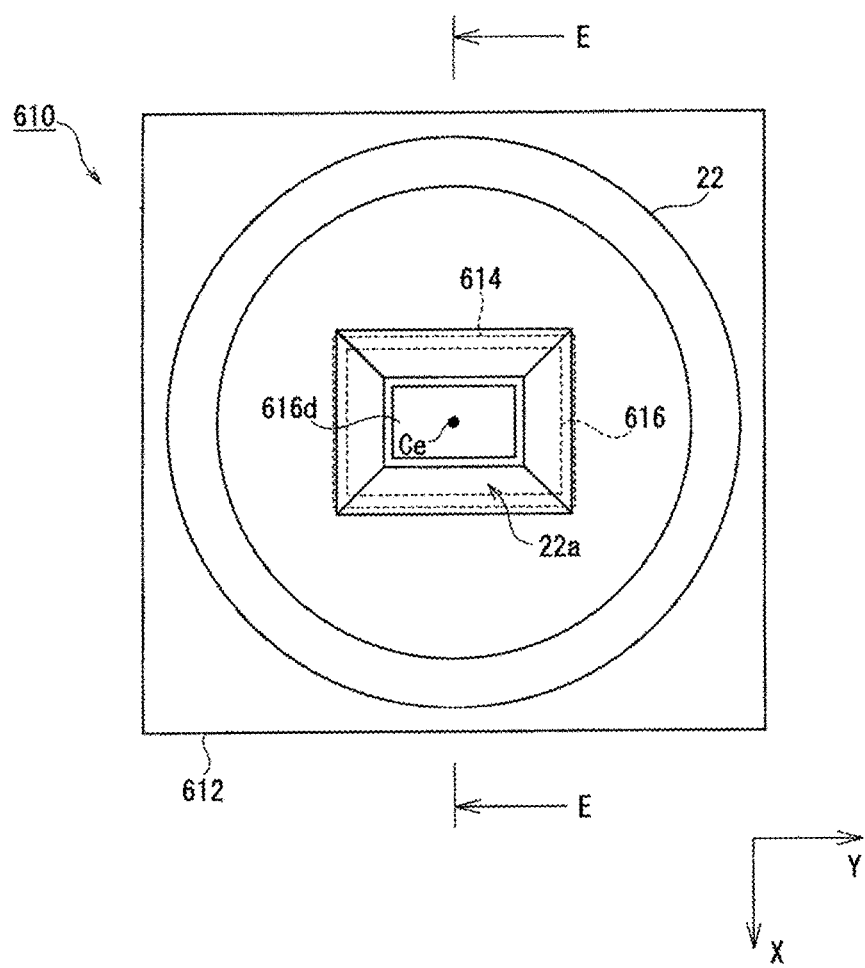
FIG. 12 is a top view of a semiconductor device according to a Preferred Embodiment 7 of the present invention.
Figure 13:
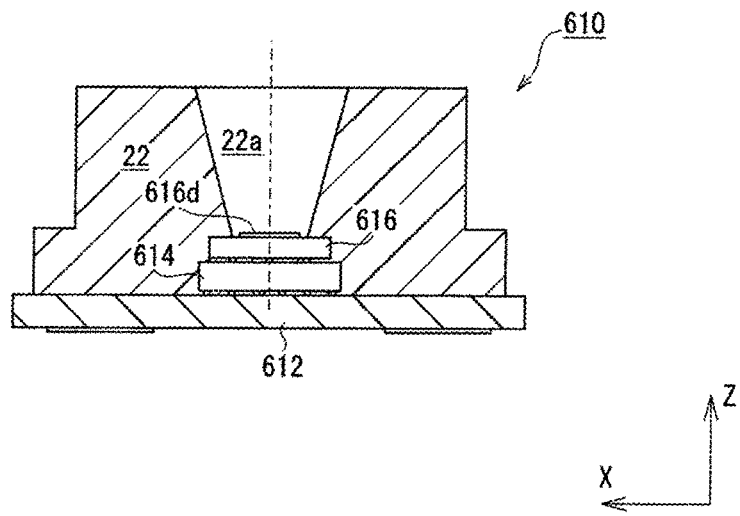
FIG. 13 is a cross-sectional view of the semiconductor device taken along a line E-E in FIG. 12.

FIG. 12 and FIG. 13 are a top view and a cross-sectional view of a semiconductor device according to Preferred Embodiment 7 of the present invention, respectively.

As illustrated in FIG. 12 and FIG. 13, in a semiconductor device 610 according to Preferred Embodiment 7, a detection device 616 may be provided on a circuit element 614 such that a center of the circuit element 614 and a center of the detection device 616 coincide or substantially coincide with each other at the same point Ce, and a center of the exposure hole 22a of the resin package 22 preferably also coincides or substantially coincides with them at the same point Ce in a top view. That is, as illustrated in FIG. 13, the center of the detection device 616 and the center of the circuit element 614 are positioned on the same or substantially the same straight line (dashed-dotted line) that is orthogonal or substantially orthogonal to a base substrate 612. Such symmetry of arrangement makes it possible to reduce a variation in stress applied to the circuit element 614 and the detection device 616 from the surrounding resin package 22 as compared with a case where the centers are offset from each other. Since characteristics of the circuit element 614 and the detection device 616 vary due to the stress, it is possible to reduce the variation in characteristics of the circuit element 614 or the detection device 616 by reducing the variation in stress.

Further, in the case of Preferred Embodiment 1 described above, the detection device 16 and the circuit element 14 that processes an output signal of the detection device 16 are separate components, but a preferred embodiment of the present invention is not limited thereto.

Preferred Embodiment 8

Figure 14:
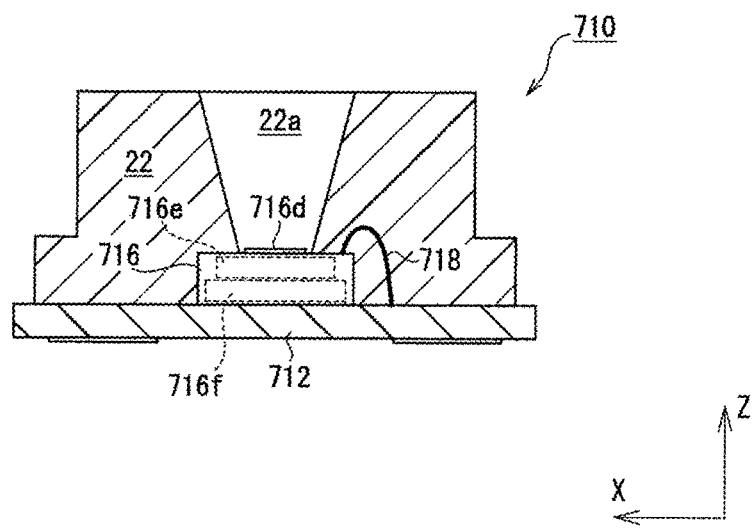
FIG. 14 is a cross-sectional view of a semiconductor device according to a Preferred Embodiment 8 of the present invention.

FIG. 14 is a cross-sectional view of a semiconductor device according to Preferred Embodiment 8 of the present invention.

As illustrated in FIG. 14, in a semiconductor device 710 according to Preferred Embodiment 8, a detection device 716 corresponds to an element into which the detection device and the circuit element in the above-described embodiments are integrated as a single component. That is, the circuit element is incorporated in the detection device.

For example, the detection device 716 is defined by one chip in which a detection circuit (corresponding to the detection device 16 in Preferred Embodiment 1) 716e that includes a detector 716d, and a signal processing circuit (corresponding to the circuit element 14 in Preferred Embodiment 1) 716f that processes a signal output from the detection circuit 716e and outputs the processed signal to the outside are incorporated. The signal processing circuit 716f of the detection device 716 is electrically connected to a base substrate 712 by bonding wires 718. The detection device 716 is provided on the base substrate 712 by one process (although, in the case of Preferred Embodiment 1 described above, two processes in which the circuit element 14 is provided on the base substrate 12, and the detection device 16 is provided on the circuit element 14 are necessary). Note that the detection device 716 may be electrically connected to the base substrate 712 with bumps interposed therebetween, instead of the bonding wires 718.

Concerning the signal processing circuit to process an output signal of the detection device, it is also possible to provide this signal processing circuit on the base substrate or in another external device which is electrically connected to the semiconductor device, instead of the circuit element.

Preferred Embodiment 9

Figure 15:
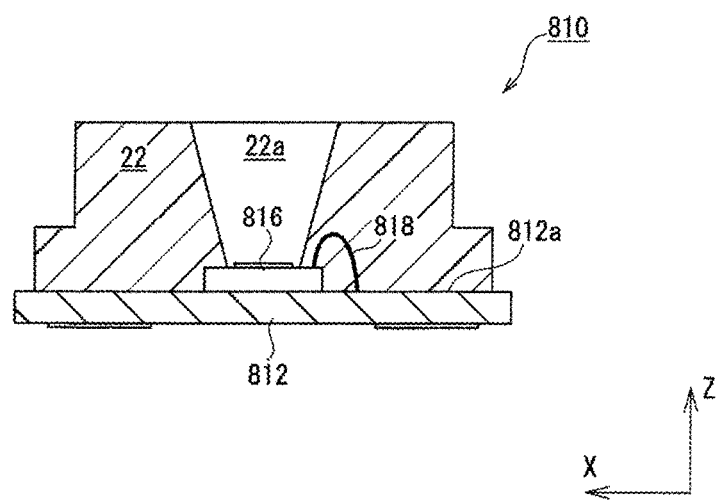
FIG. 15 is a cross-sectional view of a semiconductor device according to a Preferred Embodiment 9 of the present invention.

FIG. 15 is a cross-sectional view of a semiconductor device according to Preferred Embodiment 9 of the present invention.

As illustrated in FIG. 15, in a semiconductor device 810 according to Preferred Embodiment 9, a signal processing circuit to process an output signal of a detection device 816 is provided on a base substrate 812. For example, the signal processing circuit is provided in a portion of a first surface 812*a* of the base substrate 812 covered by the resin package 22. In this case, the circuit element in the above-described preferred embodiments is not required.

When the signal processing circuit to process an output signal of the detection device is provided outside the semiconductor device, the signal processing circuit is provided in an electronic apparatus in which the semiconductor device is provided. For example, the signal processing circuit to process an output signal of the detection device is provided on a substrate of the electronic apparatus connected to the external connection terminal of the base substrate of the semiconductor device.

Preferred Embodiment 10

Preferred Embodiment 10 of the present invention is a modified preferred embodiment of the semiconductor device according to Preferred Embodiment 3 described above. Specifically, the resin package of the semiconductor device according to Preferred Embodiment 3 is modified.

Figure 16:
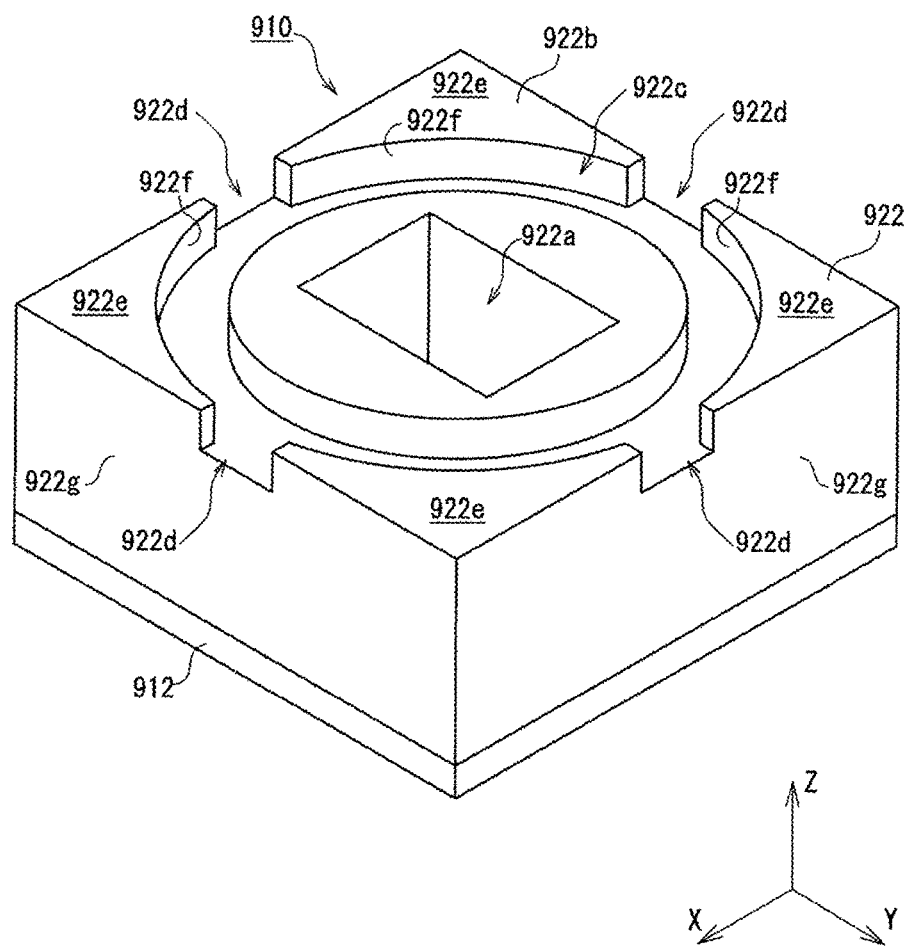
FIG. 16 is a perspective view of a semiconductor device according to a Preferred Embodiment 10 of the present invention.

FIG. 16 is a perspective view of a semiconductor device according to Preferred Embodiment 10 of the present invention.

As illustrated in FIG. 16, a resin package 922 of a semiconductor device 910 according to Preferred Embodiment 10 includes, as with the resin package 222 of the semiconductor device 210 according to Preferred Embodiment 3 described above and illustrated in FIG. 6, an annular groove 922*c* as an concave-convex portion to support an O-ring on a first surface 922*b* where an exposure hole 922*a* is open. However, unlike Preferred Embodiment 3 described above, the resin package 922 according to Preferred Embodiment 10 further includes a plurality of grooves 922*d* extending from the annular groove 922*c* toward the outside.

Specifically, the plurality of grooves 922*d* are provided in thinner portions than the other portions of an outer circumferential wall portion 922*e* of the annular groove 922*c*. That is, the groove 922*d* is provided by removing the thin portion. Note that the outer circumferential wall portion 922*e* is between an outer circumferential wall surface 922*f* defining the annular groove 922*c* and outer circumferential surfaces 922*g* of the resin package 922 (four surfaces extending from an outer edge of the first surface 922*b*).

When the plurality of grooves 922*d* are not provided, depending on a type of resin material of the resin package 922, there is a possibility that the thin portion of the outer circumferential wall portion 922*e* is damaged when the O-ring is attached to the annular groove 922*c* during handling of the semiconductor device 910, for example. Then, there is a possibility that fragments thereof enter the electronic apparatus.

By providing the grooves 922*d* at the thin portions of the outer circumferential wall portion 922*e*, that is, by removing the thin portions themselves to provide the grooves 922*d*, the chipping of the thin portions is reduced or prevented.

Preferred Embodiment 11

In the case of Preferred Embodiment 5 described above, as illustrated in FIG. 10, the size of the detection device 416 and the size of the circuit element 414 are different from each other, and the detection device 416 is mounted on the circuit element 414. In addition, the detection device 416 is electrically connected to the base substrate 412 by the bonding wires 420 without the circuit element 414 interposed therebetween. However, preferred embodiments of the present invention are not limited to this.

Figure 17:
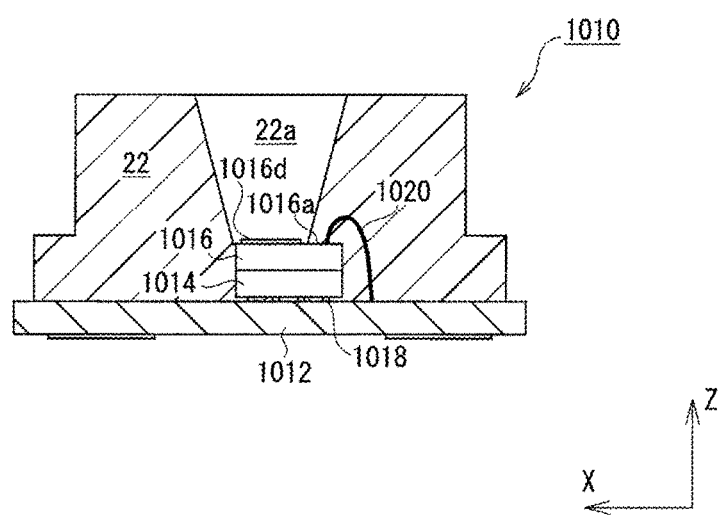
FIG. 17 is a cross-sectional view of a semiconductor device according to a Preferred Embodiment 11 of the present invention.

FIG. 17 is a cross-sectional view of a semiconductor device according to Preferred Embodiment 11 of the present invention.

In a case of a semiconductor device 1010 according to Preferred Embodiment 11, a detection device 1016 is mounted on a circuit element 1014. In addition, a size of the detection device 1016 and a size of the circuit element 1014 are the same or substantially the same as each other when viewed in a direction (Z-axis direction) in which the detection device 1016 and the circuit element 1014 face with each other.

The detection device 1016 is electrically connected to a base substrate 1012 by bonding wires 1020 without the circuit element 1014 interposed therebetween. The bonding wires 1020 and pads (portions near the pads on a first surface 1016*a*) of the detection device 1016 connected to the bonding wires 1020 are embedded in the resin package 22.

The circuit element 1014 is electrically connected to the base substrate 1012 by bumps 1018 instead of bonding wires because the detection device 1016 which has the same or substantially the same in size is mounted on the circuit element 1014.

Note that in Preferred Embodiment 11, the circuit element 1014 and the detection device 1016 may be electrically connected to each other with bumps interposed therebetween.

Preferred Embodiment 12

In the case of Preferred Embodiment 1 described above, as illustrated in FIG. 2B and FIG. 3A, a portion of the first surface 16*a* of the detection device 16 is covered by the resin package 22. Accordingly, the plurality of pads 16*c* provided on the first surface 16*a* are covered and protected by the resin package 22. However, preferred embodiments of the present invention are not limited to this.

Figure 18:
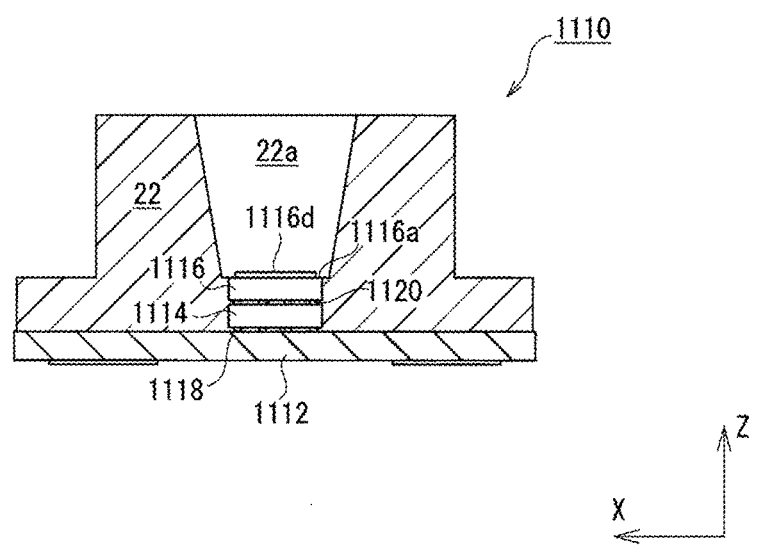
FIG. 18 is a cross-sectional view of a semiconductor device according to a Preferred Embodiment 12 of the present invention.

FIG. 18 is a cross-sectional view of a semiconductor device according to Preferred Embodiment 12 of the present invention.

As illustrated in FIG. 18, when a detection device 1116 and a circuit element 1114 are miniaturized, and when a size of the detection device 1116 and a size of the circuit element 1114 are the same or substantially the same as each other when viewed in a direction (Z-axis direction) in which the detection device 1116 and the circuit element 1114 face with each other, the detection device 1116 is embedded in the resin package 22 without an entire first surface 1116*a* thereof being covered by the resin package 22. Note that, in this case, a detector 1116*d* is provided over the entire or substantially the entire first surface 1116*a* of the detection device 1116. That is, the first surface 1116*a* of the detection device 1116 is not provided with a conductor pattern, such as a plurality of pads, to be protected by being covered by the resin package 22.

Further, the detection device 1116 is electrically connected to a base substrate 1112 with the circuit element 1114 interposed therebetween. Accordingly, the detection device 1116 is electrically connected to the circuit element 1114 with bumps 1120 interposed therebetween. Additionally, the circuit element 1114 is electrically connected to the base substrate 1112 through bumps 1118, instead of bonding wires, because the detection device 1116 having substantially the same size is mounted on the circuit element 1114.

In a case of Preferred Embodiment 12, since the detection device 1116 and the circuit substrate 1114 are miniaturized, the cost of a semiconductor device 1110 can be reduced.

In addition, in the case of Preferred Embodiment 1 described above, the semiconductor device 10 is a pressure sensor that measures pressure. However, preferred embodiments of the present invention are not limited to this. For example, a semiconductor device according to a preferred embodiment of the present invention may be a sensor that detects (measures) light, ultrasonic waves, specific gas, or the like, or may be a microphone. That is, the semiconductor devices according to preferred embodiments of the present invention includes a detection device capable of detecting a detection target by the detector by exposing the detector to the outside of the semiconductor device. For example, when the semiconductor device is an optical sensor configured to detect light, a photodiode is provided as the detection device. Further, for example, when the semiconductor device is an ultrasonic sensor configured to detect ultrasonic waves, an ultrasonic transducer is provided as the detection device.

Although the present invention has been described above with reference to a plurality of preferred embodiments, it will be apparent to those skilled in the art that preferred embodiments can be fully or partially combined with at least another preferred embodiment into still another preferred embodiment according to the present invention.

Preferred embodiments of the present invention can be applied to a waterproof semiconductor device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
    a base substrate;
    a detection device provided on the base substrate and including a detector;
    a first connector electrically connecting the base substrate and the detection device; and
    a resin package provided on the base substrate and embedded with the detection device and the first connector; wherein
    the resin package includes an exposure hole exposing the detector of the detection device to an outside, a concave-convex portion, an outer circumferential surface having a cylindrical or substantially cylindrical shape, and a flange portion continuous with the outer circumferential surface and defining the concave-convex portion; and
    in a direction in which the resin package projects from the base substrate, a height of the flange portion is equal to, substantially equal to, or greater than a height of the detection device.

2. The semiconductor device according to claim 1, wherein the resin package includes a circumferential groove provided on an outer circumferential surface of the resin package and defining the concave-convex portion.

3. The semiconductor device according to claim 1, wherein the resin package includes an annular groove provided on a first surface at which the exposure hole is open, surrounding an opening portion of the exposure hole, and defining the concave-convex portion.

4. The semiconductor device according to claim 3, wherein in the resin package, a groove extending outward from the annular groove is provided in a thinner portion than another portion on an outer circumferential wall portion of the annular groove.

5. The semiconductor device according to claim 1, further comprising:
    a circuit element provided on the base substrate; and
    a second connector electrically connecting the base substrate and the circuit element; wherein
    the circuit element and the second connector are embedded in the resin package.

6. The semiconductor device according to claim 5, wherein the detection device is provided on the base substrate with the circuit substrate interposed between the detection device and the base substrate.

7. The semiconductor device according to claim 6, wherein the first connector is electrically connected to the base substrate through the circuit element and the second connector.

8. The semiconductor device according to claim 6, wherein a center of the circuit element and a center of the detection device coincide or substantially coincide with each other in a top view.

9. The semiconductor device according to claim 1, further comprising:
    a circuit element included in the detection device.

10. The semiconductor device according to claim 1, wherein the base substrate includes a signal processing circuit configured to process an output signal of the detection device.

11. The semiconductor device according to claim 1, wherein the first connector includes a bonding wire or a bump.

12. The semiconductor device according to claim 1, wherein the detection device includes a pressure sensor to detect a change in pressure.

13. An electronic apparatus comprising:
    the semiconductor device according to claim 1;
    an O-ring supported by the concave-convex portion of the semiconductor device; and
    a housing to which the semiconductor device and the O-ring are attached.

14. The electronic apparatus according to claim 13, wherein the resin package includes an outer circumferential surface having a cylindrical or substantially cylindrical shape and a flange portion continuous with the outer circumferential surface and defining the concave-convex portion.

15. The electronic apparatus according to claim 13, wherein the resin package includes a circumferential groove provided on an outer circumferential surface of the resin package and defining the concave-convex portion.

16. The electronic apparatus according to claim 13, wherein the resin package includes an annular groove provided on a first surface at which the exposure hole is open, surrounding an opening portion of the exposure hole, and defining the concave-convex portion.

17. The electronic apparatus according to claim 16, wherein in the resin package, a groove extending outward from the annular groove is provided in a thinner portion than another portion on an outer circumferential wall portion of the annular groove.

18. The electronic apparatus according to claim 13, further comprising:
    a circuit element provided on the base substrate; and
    a second connector electrically connecting the base substrate and the circuit element; wherein the circuit element and the second connector are embedded in the resin package.

19. The electronic apparatus according to claim 18, wherein the detection device is provided on the base substrate with the circuit substrate interposed between the detection device and the base substrate.

20. A semiconductor device comprising:
a base substrate;
a detection device provided on the base substrate and including a detector;
a first connector electrically connecting the base substrate and the detection device; and
a resin package provided on the base substrate and embedded with the detection device and the first connector; wherein
the resin package includes an exposure hole exposing the detector of the detection device to an outside, and a concave-convex portion, and a circumferential groove provided on an outer circumferential surface of the resin package and defining the concave-convex portion.

21. The semiconductor device according to claim 20, wherein the first connector includes a bonding wire or a bump.

22. The semiconductor device according to claim 20, wherein the detection device includes a pressure sensor to detect a change in pressure.

23. An electronic apparatus comprising:
conductor device according to claim 20;
an O-ring supported by the concave-convex portion of the semiconductor device; and
a housing to which the semiconductor device and the O-ring are attached.

24. A semiconductor device comprising:
a base substrate;
a detection device provided on the base substrate and including a detector;
a first connector electrically connecting the base substrate and the detection device; and
a resin package provided on the base substrate and embedded with the detection device and the first connector; wherein
the resin package includes an exposure hole exposing the detector of the detection device to an outside, a concave-convex portion, and an annular groove provided on a first surface at which the exposure hole is open, surrounding an opening portion of the exposure hole, and defining the concave-convex portion.

25. The semiconductor device according to claim 24 wherein the first connector includes a bonding wire or a bump.

26. The semiconductor device according to claim 24, wherein the detection device includes a pressure sensor to detect a change in pressure.

27. An electronic apparatus comprising:
conductor device according to claim 24;
an O-ring supported by the concave-convex portion of the semiconductor device; and
a housing to which the semiconductor device and the O-ring are attached.

28. A semiconductor device comprising:
a base substrate;
a detection device provided on the base substrate and including a detector;
a circuit element included in the detection device;
a first connector electrically connecting the base substrate and the detection device; and
a resin package provided on the base substrate and embedded with the detection device and the first connector; wherein
the resin package includes an exposure hole exposing the detector of the detection device to an outside, and a concave-convex portion.

29. The semiconductor device according to claim 28, wherein the first connector includes a bonding wire or a bump.

30. The semiconductor device according to claim 28, wherein the detection device includes a pressure sensor to detect a change in pressure.

31. An electronic apparatus comprising:
conductor device according to claim 28;
an O-ring supported by the concave-convex portion of the semiconductor device; and
a housing to which the semiconductor device and the O-ring are attached.

32. A semiconductor device comprising:
a base substrate;
a detection device provided on the base substrate and including a detector;
a first connector electrically connecting the base substrate and the detection device; and
a resin package provided on the base substrate and embedded with the detection device and the first connector; wherein
the base substrate includes a signal processing circuit configured to process an output signal of the detection device; and
the resin package includes an exposure hole exposing the detector of the detection device to an outside, and a concave-convex portion.

33. The semiconductor device according to claim 32, wherein the first connector includes a bonding wire or a bump.

34. The semiconductor device according to claim 32, wherein the detection device includes a pressure sensor to detect a change in pressure.

35. An electronic apparatus comprising:
conductor device according to claim 32;
an O-ring supported by the concave-convex portion of the semiconductor device; and
a housing to which the semiconductor device and the O-ring are attached.

* * * * *